United States Patent
Watanabe et al.

(10) Patent No.: US 6,464,511 B1
(45) Date of Patent: Oct. 15, 2002

(54) IC SOCKET AND IC TESTER

(75) Inventors: Fumio Watanabe; Satoshi Takeshita, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/763,568
(22) PCT Filed: Nov. 17, 1999
(86) PCT No.: PCT/JP99/06404
§ 371 (c)(1), (2), (4) Date: Feb. 22, 2001
(87) PCT Pub. No.: WO01/37381
PCT Pub. Date: May 25, 2001

(51) Int. Cl.⁷ ............................ H01R 12/00; H05K 1/00
(52) U.S. Cl. .......................................... 439/66; 439/700
(58) Field of Search ........................... 439/66, 700, 482, 439/824

(56) References Cited

U.S. PATENT DOCUMENTS 5,727,954 A    3/1998  Kato et al. ............ 439/66
6,053,777 A *  4/2000  Boule ..................... 439/482

FOREIGN PATENT DOCUMENTS

| DE | 69700120 | 2/1997 |
|----|----------|--------|
| EP | 0838878  | 4/1998 |
| JP | 8213088  | 8/1996 |
| JP | 10214649 | 8/1998 |
| JP | 10261447 | 9/1998 |
| JP | 11176547 | 7/1999 |
| JP | 11273819 | 10/1999 |

* cited by examiner

*Primary Examiner*—Hien Vu
*Assistant Examiner*—Felix O. Figueroa
(74) *Attorney, Agent, or Firm*—David N. Lathrop, Esq.; Gallagher & Lathrop

(57) ABSTRACT

A housing and a bottom cover are secured together and have pairs of aligned through-apertures, and probe pins are accommodated in respective pairs of through-apertures to provide an IC socket. Each probe pin comprises a tube having a stop flange formed around its outer periphery, a movable plunger accommodated in the tube such that an extension portion of the movable plunger in urged to project out of a narrowed first end portion of the tube by a first coil spring, and a fixed plunger fitted to a second end portion of the tube. Each probe pin is urged by a second coil spring such that the stop flange on the tube is urged into abutment with a shoulder portion of a through-aperture of the bottom cover, whereby a tip end of the fixed plunger is projected beyond the outer surface of the bottom cover and a tip end of the movable plunger is projected beyond the outer surface of the housing.

5 Claims, 7 Drawing Sheets

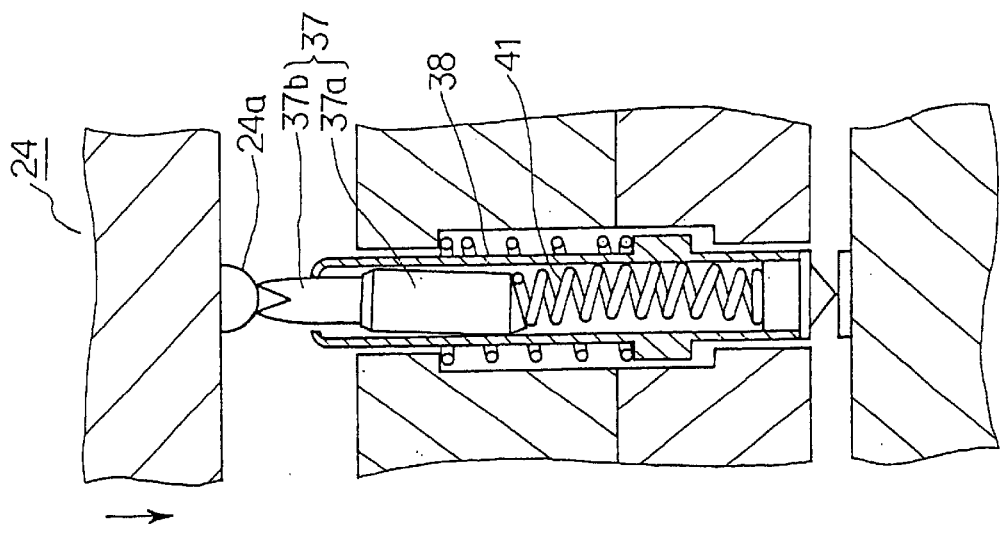
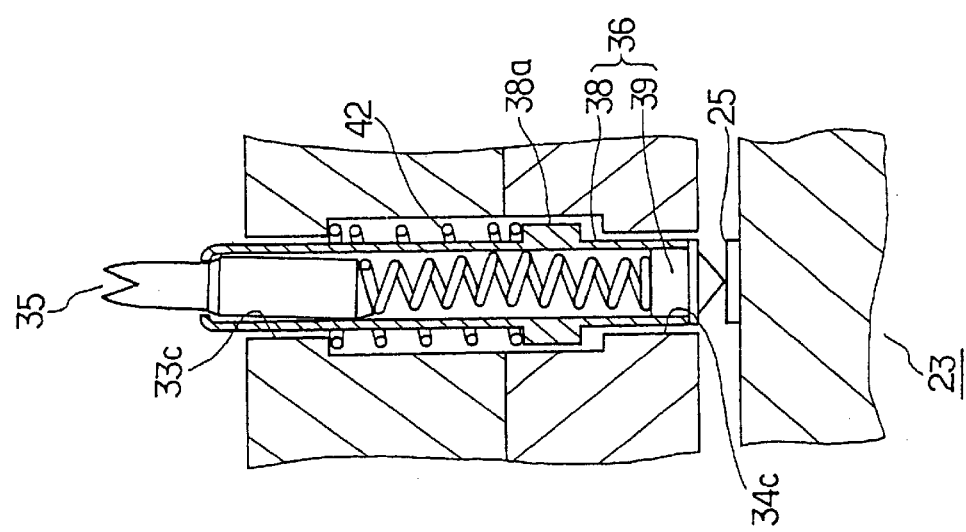
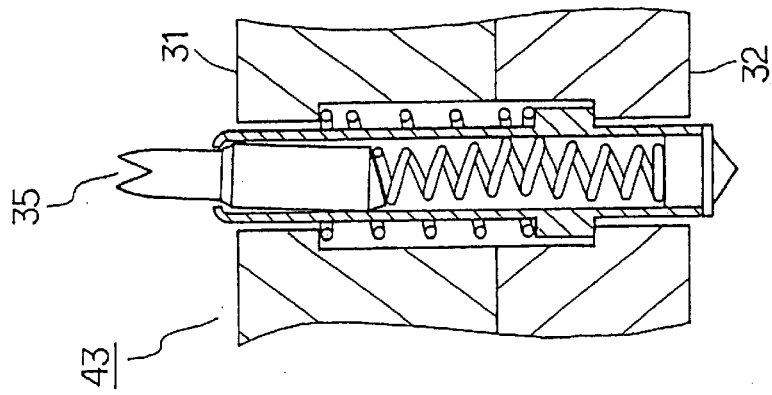

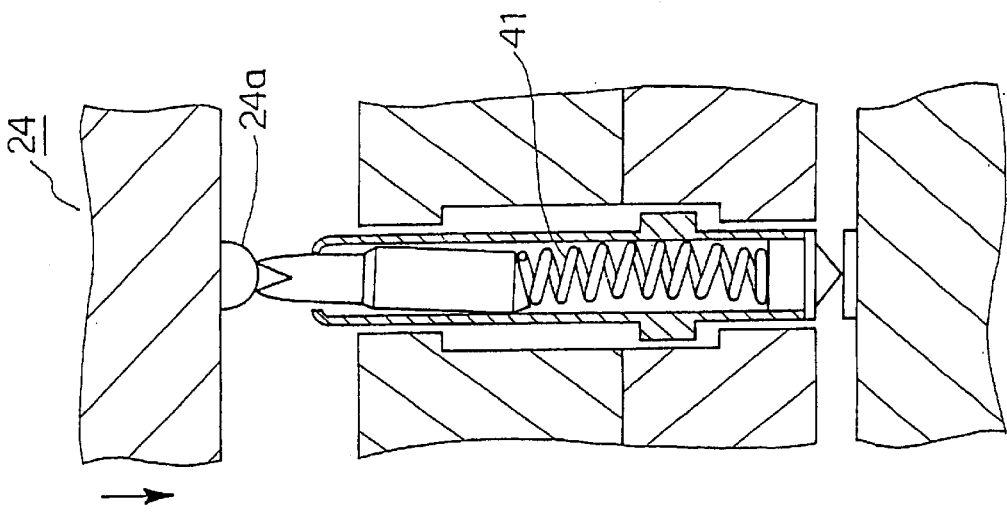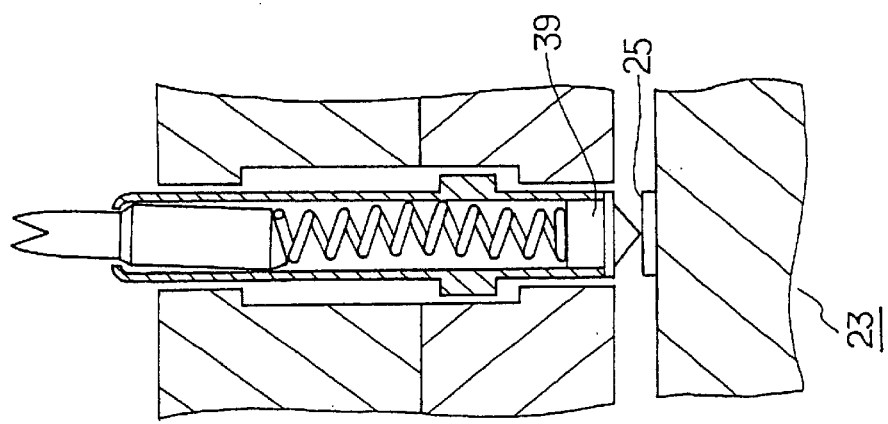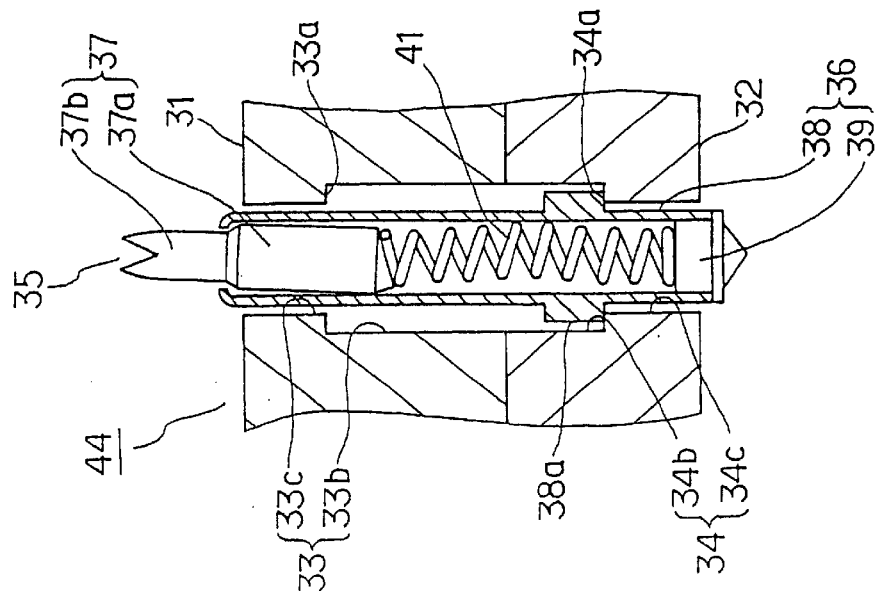

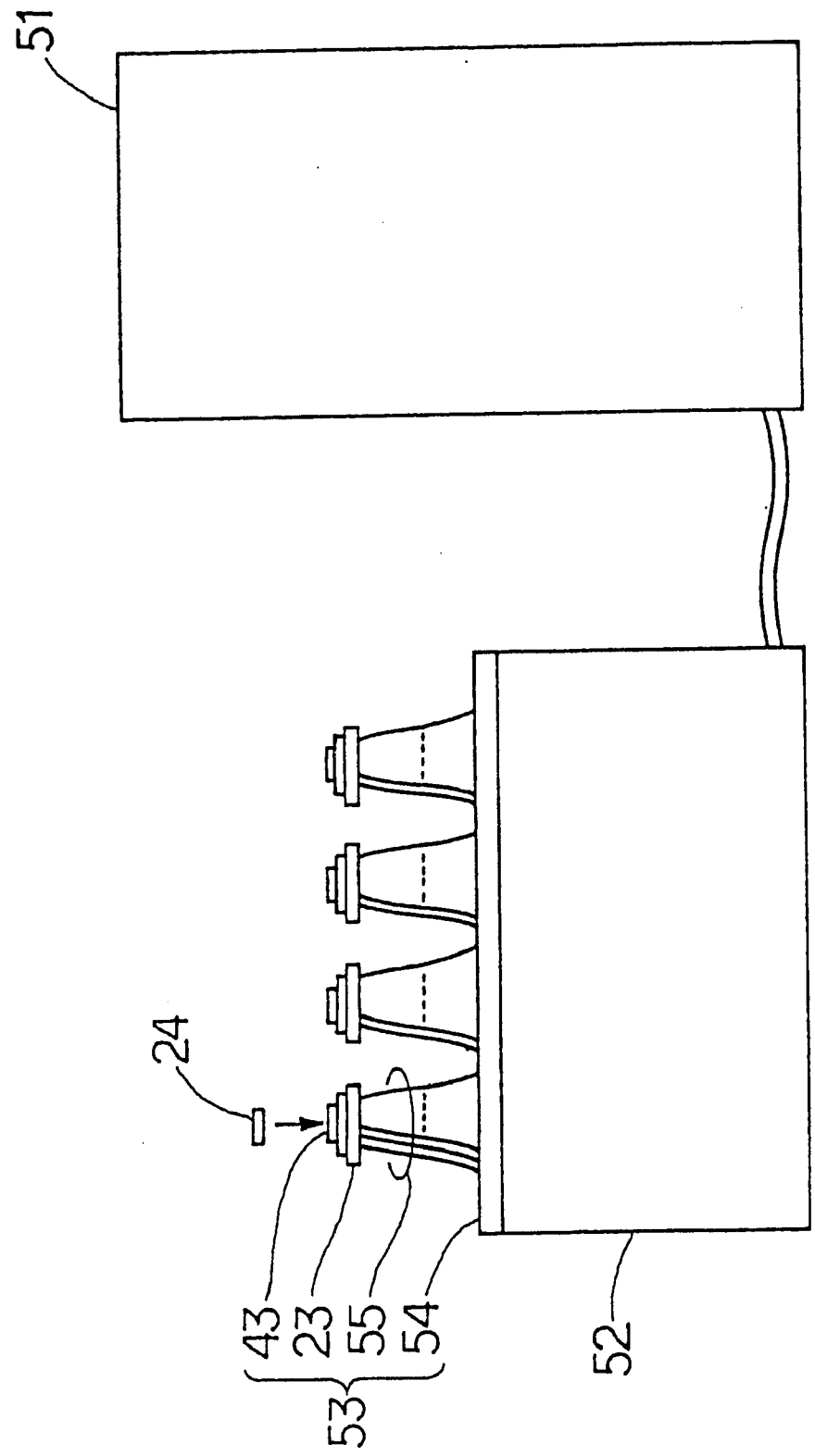

PRIOR ART

IC SOCKET AND IC TESTER

FIELD OF THE INVENTION

This invention relates to an integrated circuit (IC) testing apparatus, and more particularly to the construction of an IC socket onto which semiconductor devices being tested (ICs being tested) are to be placed for electrical connection and which is superior in the contact stability.

THE BACKGROUND ART

FIG. 5 is a schematic view illustrating the exterior appearance of a prior art IC socket of this type, and FIG. 6 shows the details of the construction thereof. The IC socket 11 comprises a plastic housing 13 in which a number of probe pins 12 are carried. In the illustrated example, the IC socket 11 is adapted to accommodate CSPs (Chip Size Packages) such as BGA (Ball Grid Array) and has a grid array of several tens of probe pins 12. It is to be understood that in FIG. 5 the probe pins 12 are symbolized to illustrate only the positions of the array of the pins.

As shown in FIG. 6, each of the probe pins 12 comprises a metallic tube 14, a fixed plunger 15 integrally fixed to the tube at one end thereof, and a movable plunger 17 disposed at the opposite end and biased by a coil spring 16. A tube assembly 18 comprising the tube 14 and the fixed plunger 15 is held in place by the housing 13 and a bottom cover 21 with one end portion of the tube assembly accommodated in a through-aperture 19 formed through the housing 13 and the other end portion accommodated in a through-aperture 22 formed through the bottom cover 21. The bottom cover 21 is made of resin and is fastened to the housing 13 as by screws, not shown in FIG. 6.

The IC socket 11 is mounted on a socket board in use and devices to be tested are successively mounted on the IC socket in that state to be subjected to testing. FIG. 7 shows how the probe pin 12 works during the testing. Specifically, FIG. 7A shows the probe pin 12 before the IC socket 11 is mounted on the socket board 23; FIG. 7B shows the probe pin 12 after the IC 11 socket has been mounted on the socket board 23; and FIG. 7C shows the probe pin 12 when a device 24 to be tested is mounted on the IC socket 11.

When the IC socket 11 is mounted on the socket board 23, the movable plunger 17 of the probe pin 12 is urged upwardly by an electrode pad 25 on the socket board 23 as shown in FIG. 7B whereby the entire probe pin 12 is moved upward until stop means 14a formed on the outer periphery of the tube 14 comes into abutment against the interior wall 13a of the housing 13. Further urging by the electrode pad forces the movable plunger 17 into the tube to compress the coil spring 16, so that the movable plunger 17 and the electrode pad 25 are maintained in pressure contact by the restoring force of the coil spring 16.

FIG. 7C illustrates the device 24 to be tested as being a BGA having solder balls 24a as terminals. As the device 24 being tested is loaded on the IC socket 11, the solder ball 24a presses on the fixed plunger 15 whereby the tube assembly 18 is moved downwardly while the coil spring 16 is further compressed, so that the solder ball 24a and the fixed plunger 15 are maintained in pressure contact by the restoring force of the coil spring 16.

Upon completion of the testing, the device 24 being tested is removed whereupon the tube assembly 18 is moved upwardly back to the position shown in FIG. 7B.

As discussed above, it is to be noted that the conventional IC socket 11 is configured such that the tube assembly 18 is moved up and down as the device 24 being tested is removed from and mounted on the socket, respectively.

However, the thus constructed IC socket 1 has often encountered a situation in which the tube assembly 18 fails to return to its original position even though the device 24 under test has been removed. That is, there has often occurred the situation in which the tube assembly 18 remains pushed in so that when the next device 24 to be tested is loaded on the socket no good contact is established between the device and the socket.

Occurrence of such contact failure results in a test failure. If retesting is conducted to determine whether the test failure is due to failure of the device 24 being tested itself or to contact failure of the IC socket 11, it results in a marked increase in the average number of man-hours needed for testing. In addition, since even the retesting cannot insure that such failures distinguished one from the other, it leads to a deterioration in production. For this reason, the failure of the tube assembly 18 to return to its original position has become a serious problem.

Such failure of the tube assembly 18 to return to position arises from reduction in slidability of the tube 14. More specifically, the tube 14 is provided around its outer periphery with a stop projection 14a as described above. The stop projection 14a is formed by removing, by machining operation, the rest of the outer peripheral material of the miniature tube 14 made by a drawing process other than the stop projection 14a forming portion. Hence, the slide surfaces of the tube 14 are machined surfaces having rather poor surface roughness, so that those surfaces will scratch or abrade the opponent slide surfaces of the housing 13 and bottom cover 21 and produce wear debris which will accumulate in gaps between the tube 14 and the through-apertures 19, 22, resulting in poor slidability.

It is also to be noted that the tube 14 is configured so as to be positioned by both of the through-aperture 19 in the housing 13 and the through-aperture 22 in the bottom cover 21 for sliding movement along the aperture walls. Consequently, if there is some misalignment in assembly between the housing 13 and the bottom cover 21, for example and hence the opposing through-apertures 19 and 22 are out of alignment with each other, radial forces may be exerted on the tube 14 to impair the slidability of the tube, resulting in an increase in resistance to the sliding movement which in turn brings forth a situation in which wear debris is more likely to be produced.

Accordingly, it is an object of this invention to provide an IC socket which overcomes the aforesaid drawbacks to the prior art IC socket and which has a superior contact stability attended with no deterioration of slidability.

It is another object of this invention to provide an IC testing apparatus equipped with such IC sockets having a superior contact stability.

DISCLOSURE OF THE INVENTION

According to this invention, in an IC socket comprising a housing and a bottom cover integrally secured together, the housing and the bottom cover each having an array of through-apertures formed therethrough, the through-apertures in the housing and the associated through-apertures in the bottom cover being in opposing alignment with each other, and a probe pin being accommodated and held in each pair of the oppositely aligned through-apertures, each of the probe pins comprising: a tube assembly including a tube having a narrowed one end and a stop means in the form of a flange formed around the outer periphery of the tube intermediate its opposite ends and a fixed plunger fixedly fitted in the other end of the tube; a movable plunger having a base portion accommodated in the tube and restrained by the narrowed one end against axial dislocation therefrom and an extension extending from the base portion out through the narrowed one end and adapted to make pressure contact with a terminal of a device being tested; a first resilient member housed in the tube to urge the movable plunger in such a direction as to extend the plunger out of the narrowed one end; and a second resilient member surrounding the tube and interposed between the inner surface of the housing and the stop means, wherein the tube assembly is held in position with its opposite ends accommodated in the associated pair of oppositely aligned through-apertures, the stop means being urged by the second resilient member into abutment with the inner surface of the bottom cover whereby the forward end of the fixed plunger is projected beyond the outer surface of the bottom cover.

It is thus to be appreciated that the movable plunger is moved vertically up and down as the device being tested is removed from and mounted on the socket, respectively and that the movable plunger slides along the inner peripheral surface of the tube having a relatively low surface roughness so that good slidability is insured to provide for an IC socket having a superior contact stability.

BRIEF DESCRIPTION OF THE DRAWINGS

FIG. 2 is a view illustrating how the probe pin of the IC socket shown in FIG. 1 works;

FIG. 3 is a view illustrating how the probe pin of another embodiment of the IC socket according to this invention works;

FIG. 4 is a view schematically illustrating the arrangement of the IC testing apparatus according to this invention;

BEST MODES FOR CARRYING OUT THE INVENTION

Figure 1:
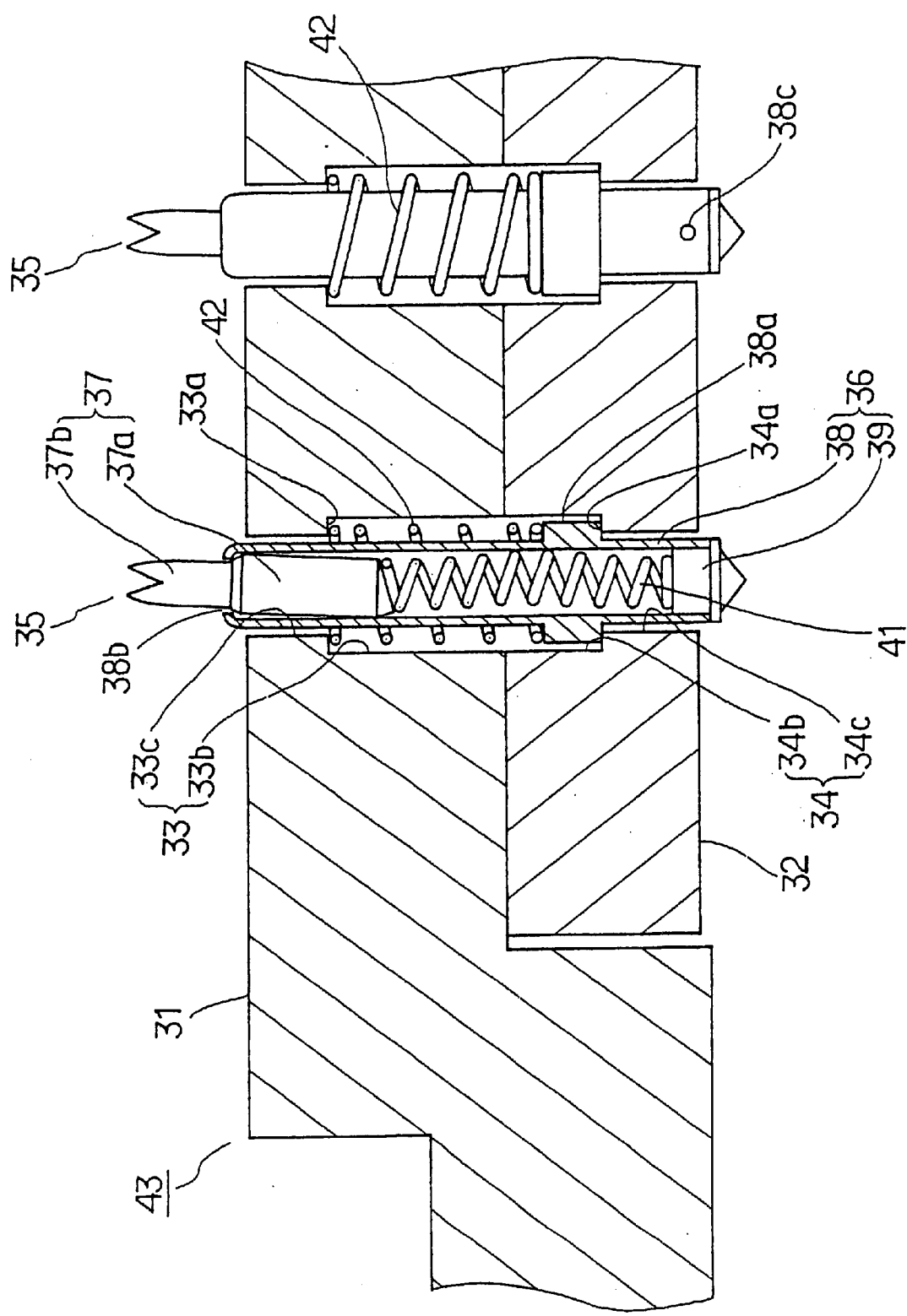
FIG. 1 is a view illustrating, in cross-section, a principal part of a preferred embodiment of the IC socket according to this invention.
Figure 5:
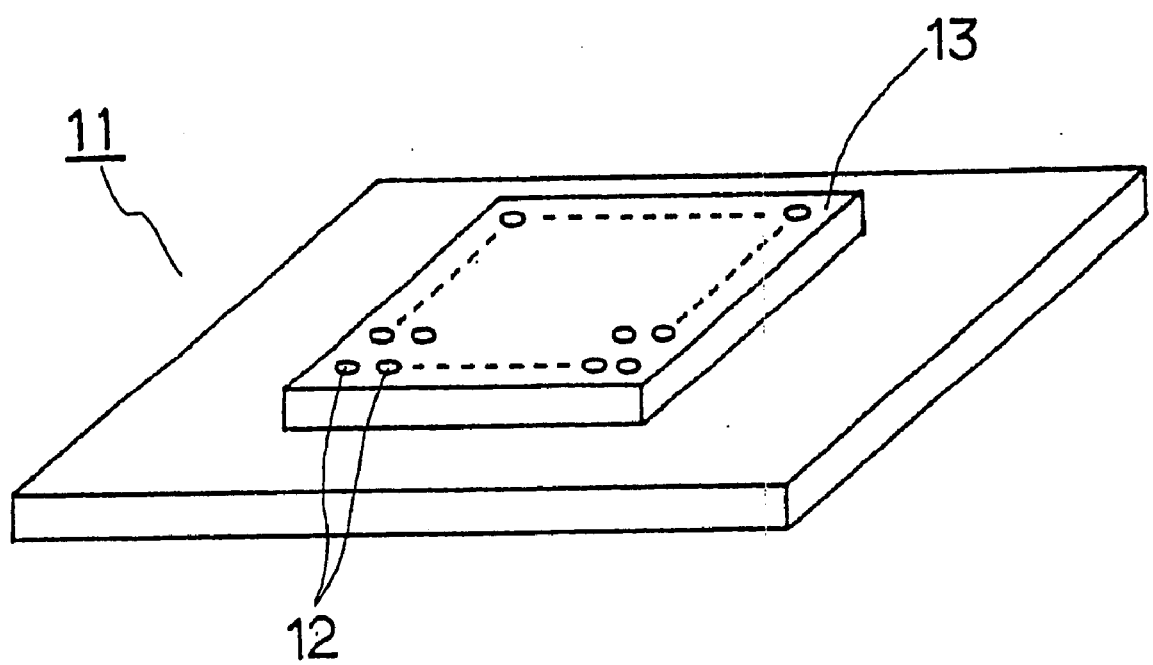
FIG. 5 is a schematic view illustrating the exterior appearance of a prior art IC socket.
Figure 6:
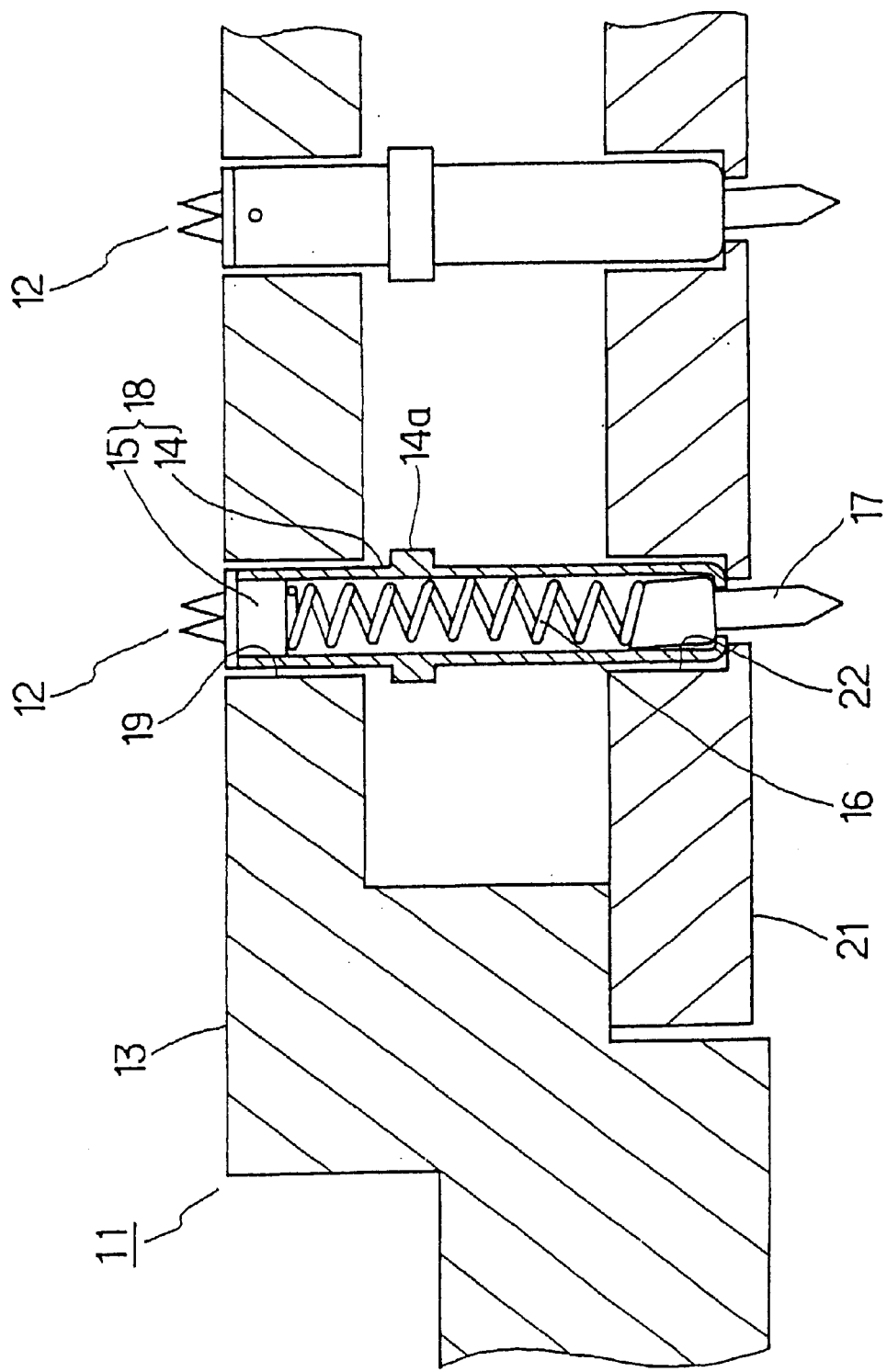
FIG. 6 is a view illustrating, in cross-section, the principal part of the IC socket shown in FIG. 5.
Figure 7A:
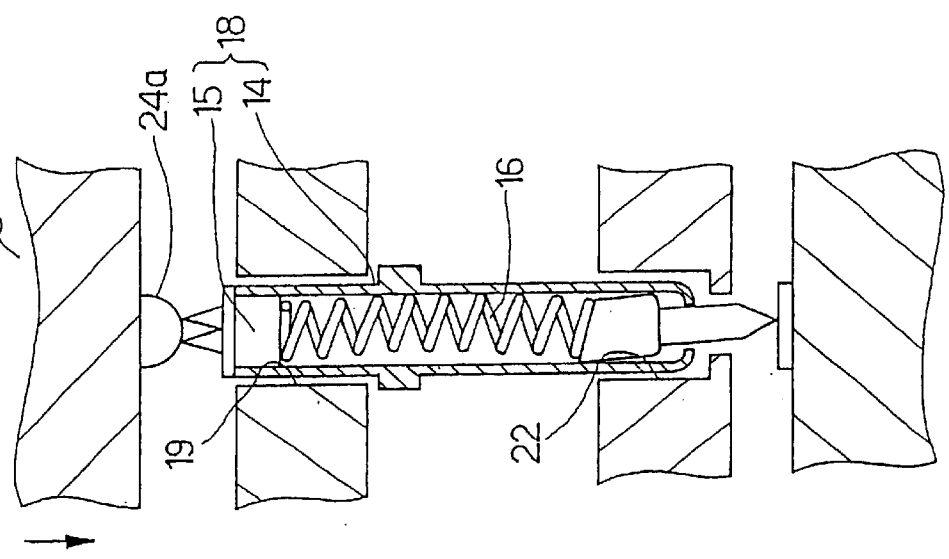
FIG. 7 is a view illustrating how the probe pin of the IC socket shown in FIG. 5 works.
Figure 7B:
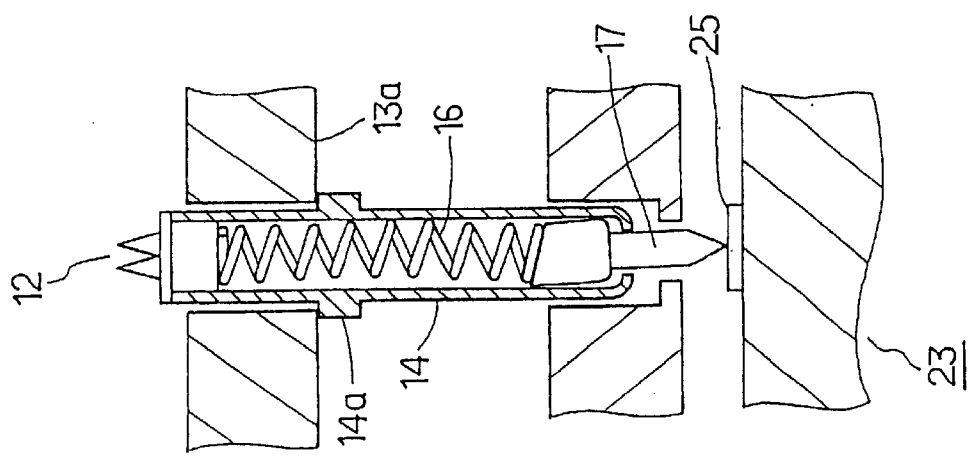
Figure 7C:
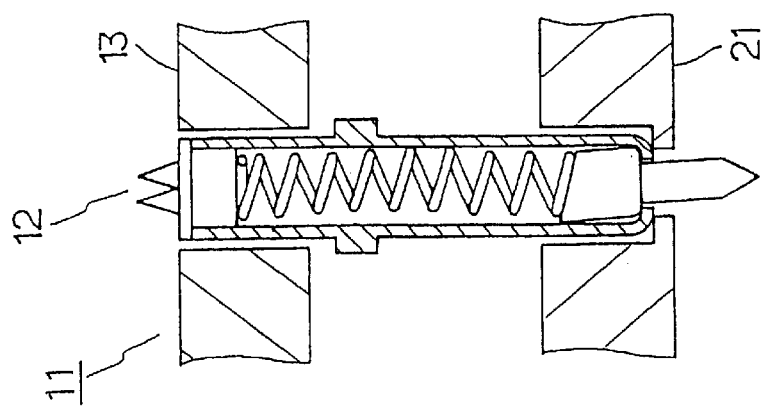

The invention will be described in details with reference to the accompanying drawings. FIG. 1 is a view illustrating, in cross-section, the details of the principal part of a preferred embodiment of the IC socket according to this invention. The housing 31 and the bottom cover 32 have through-apertures 33 and 34, respectively formed therethrough in an array corresponding to that of terminals of a device to be tested. The housing 31 and the bottom cover 32 are integrally secured together with their through-apertures 33 and 34 being in opposed alignment with each other. It should be noted that the exterior appearance of the housing 31 is similar to that of the housing 13 shown in FIG. 5.

Fixation of the bottom cover 32 to the housing 31 is effected, with probe pins 35 accommodated and held in place in the through-apertures 33, 34, as by screws not shown in FIG. 1. These housing 31 and bottom cover 32 may be made of resin. It is also to be noted that the through-apertures 33 and 34 are both stepped apertures with inner enlarged-diameter portions 33b, 34b and outer small-diameter portions 33c, 34c, respectively separated from each other by shoulder portions 33a, 34a, respectively.

Each of the probe pins 35 comprises a tube assembly 36, a movable plunger 37 and resilient members.

The tube assembly 36 is composed of a tube 38 and a fixed plunger 39. The tube 38 is a miniature tube made by a drawing process and having a stop means 38a in the form of a flange formed around the outer periphery of the tube intermediate its opposite ends by machining operation on the outer periphery and having a narrowed end 38b. The fixed plunger 39 is securely fitted in the other end of the tube 38 and terminates in a conical end. In FIG. 1, 38c indicates a punched mark where the fixed plunger 39 has been riveted to the tube.

The movable plunger 37 comprises a base portion 37a accommodated in the tube 38 and restrained by the narrowed one end 38b against axial withdrawal therefrom and an extension 37b extending from the base portion out through the narrowed one end 38b and adapted to make pressure contact with a terminal of a device being tested. While only schematically shown in the drawings, the extension 37b terminates in four protrusions circumferentially equally spaced so as to insure good contact with a solder ball of a BGA.

A resilient member housed in the tube 38 so as to urge the movable plunger 37 in such a direction as to extend the plunger out of the one end 38b is illustrated in this example as comprising a coil spring 41. It should be noted that the bottom surface of the base portion 37a of the movable plunger 37 abutting with one end of the coil spring 41 comprises an inclined surface whereby the coil spring 41 is curved in the shape of a bow to be partially in contact with the inner periphery of the tube 38.

The tube 38, the fixed plunger 39 and the movable plunger 37 may be formed of copper-based alloy material such as beryllium copper.

The probe pin 35 is positioned in place with the opposite ends of the tube assembly 36 accommodated in the small-diameter portions 33c, 34c of the associated through-apertures 33, 34. In this state, the stop means 38a is urged into abutment with the inner surface of the bottom cover 32 by a resilient member surrounding the tube and interposed between the inner surface of the housing 31 and the stop means 38a.

The resilient member urging the stop means 38a is illustrated in this example as comprising a coil spring 42 which is accommodated in the enlarged-diameter portions 33b, 34b with one end of the spring abutting against the shoulder 33a of the housing 31 and the opposite end abutting against the stop means 38a. It is to be noted here that the stop means 38a is normally in abutment with the shoulder 34a of the bottom cover 32. In this condition, the outer end of the fixed plunger 39 is extended beyond the outer surface of the bottom cover 32.

The operation of the probe pin 35 of the IC socket 43 constructed as described above will now be explained with reference to FIG. 2. FIG. 2A shows the probe pin 35 before the IC socket 43 is mounted on the socket board 23; FIG. 2B shows the probe pin 35 after the IC socket 43 has been mounted on the socket board 23; and FIG. 2C shows the probe pin 35 when a device 24 to be tested is mounted on the IC socket 43.

When the IC socket 43 is mounted on the socket board 23, the fixed plunger 39 of the probe pin 35 is urged upwardly by an electrode pad 25 on the socket board 23 as shown in FIG. 2B whereby the entire probe pin 35 is moved upward to compress the coil spring 42, so that the fixed plunger 39 and the electrode pad 25 are maintained in pressure contact by the restoring force of the coil spring 42.

As a device (BGA) 24 being tested is loaded on the IC socket, the movable plunger 37 is pressed on by the solder ball 24a of the device and moved downwardly to compress the coil spring 41, so that the solder ball 24a and the movable plunger 37 are maintained in pressure contact by the restoring force of the coil spring 41.

With the IC socket 43 constructed as described above, when the it is mounted on the socket board 23, the tube assembly 36 is moved upwardly while the tube 38 slides along the small-diameter portions 33c, 34c. But it is only a single time when the IC socket is mounted on the socket board 23 that such sliding motion takes place. It is thus to be appreciated that even if the slide surfaces of the tube 38 have poor surface roughness, the problem of accumulation of wear debris generated due to the sliding motion is unlikely to occur. In addition, even if there is any misalignment between the opposed small-diameter portions 33c and 34c, no problem will occur.

On the other hand, as the device 24 being tested is removed from and mounted on the socket, the movable plunger 37 is moved up and down, respectively while the base portion 37a of the plunger repeatedly slides along the inner periphery of the tube 38. However, since the inner periphery of the tube 38 has a smooth surface as formed by drawing process, the troubles such as scratching or generation of wear debris are unlikely to occur. In addition, since misalignment, if any, in assembly between the housing 31 and the bottom cover 32 would have no deleterious influence on the slidability of the tube, the plunger may be capable of repeated stable sliding movements to provide an excellent contact stability. While in this example a coil spring is employed as the resilient member urging the stop means 38a, it is to be understood that the resilient member is not limited to the coil spring but that other resilient material such as silicon rubber may be used if desired.

FIG. 3 illustrates a modified embodiment of the IC socket which is similar to but different from the IC socket 43 as described above in that the coil spring 42 is eliminated. In FIG. 3 those components corresponding to the components of the IC socket 43 shown in FIGS. 1 and 2 are indicated by like reference numerals.

With the IC socket 44 of this modified embodiment, in the state shown in FIG. 3B in which the IC socket is mounted on the socket board 23, the forward end of the fixed plunger 39 is in contact with the electrode pad 25 on the socket board 23 but with virtually no pressing force exerted on the pad. In other words, in this state no satisfactory electrical continuity has not yet been established. However, in the state shown in FIG. 3C, the fixed plunger 39 is urged downwardly by the coil spring 41 which is compressed by the downwardly moving movable plunger 37, so that the fixed plunger 39 and the electrode pad 25 are brought into pressure contact in the state shown in FIG. 3C.

FIG. 4 schematically illustrates the arrangement of the IC testing apparatus equipped with a plurality of the IC sockets 43 according to this invention. The IC testing apparatus comprises a mainframe 51, a tester head 52 and a device interface section 53. The mainframe 51 has a timing generator, a pattern generator, a format controller and others mounted therein. The tester head 52 comprises a driver section and a comparator section.

The device interface section 53 comprises a performance board 54 connector-connected with the tester head 52, socket boards 23 each having mounted thereon one of the IC sockets 43, and coaxial cables 55. A number of IC sockets 43 and socket boards 23 are provided depending on the type of the device 24 to be tested.

What is claimed is:

1. An integrated circuit (IC) socket comprising:

a housing and a bottom cover integrally secured together, said housing and bottom cover each having an array of through-apertures formed therethrough, each of said through-apertures having an inner larger-diameter portion, an outer smaller-diameter portion and a shoulder portion formed between said inner and outer portions, said inner larger-diameter portion of each of -said through-apertures in said housing being aligned with said inner larger-diameter portion of a respective through-aperture in said bottom cover, and an array of probe pins, each of said probe pins being accommodated in a respective pair of said aligned through-apertures and comprising:
tube assembly including
a tube having a narrowed first end portion,
a stop flange formed around an outer periphery of said tube, and
a first plunger fixed to a second end portion of said tube;
a second movable plunger having a base portion accommodated in said tube and restrained by said narrowed first end portion against axial dislocation therefrom, and having an extension portion extending from said base portion and projecting outwardly from the narrowed first end portion of the tube;
a first resilient member housed in said tube to urge said second movable plunger in such a first direction as to extend the second movable plunger out of the narrowed first end portion of said tube; and
a second resilient member interposed between the shoulder portion of said housing and said stop flange, wherein said stop flange is urged by said second resilient member in a second direction substantially opposite to the first direction and into abutment with the shoulder portion of said bottom cover whereby a tip end of said first plunger is projected beyond an outer surface of said bottom cover and a tip end of extension portion of said second movable plunger is projected out of the through-aperture of said housing.

2. An IC socket according to claim 1, wherein said extension portion of each of said second plungers movable is projected out of and movable through the narrowed first end portion of the tube of a respective probe pin without contacting the outer smaller-diameter portion of said housing, whereby the tip end of each movable plunger is adapted to make pressure contact with a terminal of an IC device; and each first plunger is projected out of and movable through the outer smaller-diameter portion of said bottom cover to make pressure contact with an electrode pad formed on a socket board.

3. An IC testing apparatus comprising:

a mainframe, a tester head, and a device interface section, said device interface section including socket boards each having mounted thereon the IC socket according to claim 1 onto which an IC device to be tested is mounted for testing;

wherein
- each of extension portion of each said second movable plungers is projected out of and movable through the narrowed first end portion of each tube of each of said probe pins without contacting the outer smaller-diameter portion of said housing, whereby the tip end of each of said second movable plungers is adapted to make pressure contact with a terminal of the IC device being tested that is accommodated in said IC socket; and
- each of said first plungers is projected out of and movable through the outer smaller-diameter portion of said bottom cover to make pressure contact with a corresponding electrode pad formed on said socket board.

4. The IC socket according to claim 1, wherein
- said through-aperture of said housing has a diameter larger than an outer diameter of said tube; and
- each of said probe pins is accommodated in a respective pair of through-apertures such that said narrowed end portion of the tube is projected out of and is movable through the through-aperture of said housing; whereby said extension portion of the second movable plunger moves without contacting the through-aperture of the housing.

5. An IC testing apparatus comprising:
- a mainframe,
- a tester head, and
- a device interface section, said device interface section including socket boards each having an IC socket onto which an IC device to be tested is accommodated for testing, wherein
- said IC socket comprises a housing and a bottom cover integrally secured together, said housing and bottom cover each having an array of through-apertures formed therethrough, each of said through-apertures having an inner larger-diameter portion, an outer smaller-diameter portion and a shoulder portion formed between said inner and outer portions, said through-apertures in said housing and the through-apertures in said bottom cover being aligned with each other, and
- an array of probe pins, each of said proble pins being accommodated in a respective pair of said aligned through-apertures and comprising:
  - a tube assembly including
    - a tube having a narrowed first end portion,
    - a stop flange formed around an outer periphery of said tube, and
    - a first plunger fixed to a second end portion of said tube;
  - a second movable plunger having a base portion accommodated in said tube and restrained by said narrowed first end portion against axial dislocation therefrom, and having an extension portion extending from said base portion and projecting outwardly from the narrowed first end portion of the tube;
  - a first resilient member housed in said tube to urge said second movable plunger in such a first direction as to extend the second movable plunger out of the narrowed first end portion of said tube; and
  - a second resilient member in a second direction substantially opposite to the first direction and interposed between the shoulder portion of said housing and said stop flange to urge said stop flange into abutment with the shoulder portion of said bottom cover, whereby a tip end of the extension portion of said second movable plunger is projected out beyond an outer surface of said housing without contacting the through-aperture of said housing and in pressure contact with a corresponding-terminal of the IC device under testing, while a tip end of said first plunger is projected out beyond an outer surface of said bottom cover and in pressure contact with a corresponding electrode pad formed on said socket board.

* * * * *